US012716938B2

(12) United States Patent
Choi et al.

(10) Patent No.: US 12,716,938 B2
(45) Date of Patent: Aug. 25, 2026

(54) TEST DEVICE AND SEMICONDUCTOR MANUFACTURING APPARATUS INCLUDING TEST DEVICE

(71) Applicant: Samsung Electronics Co., Ltd., Suwon-si (KR)

(72) Inventors: Jihyun Choi, Suwon-si (KR); Seonmi Lee, Suwon-si (KR); Yonggyun Kim, Suwon-si (KR); Seongseob Shin, Suwon-si (KR); Dahm Yu, Suwon-si (KR); Dongho Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 197 days.

(21) Appl. No.: 18/620,170

(22) Filed: Mar. 28, 2024

(65) Prior Publication Data

US 2025/0012854 A1 Jan. 9, 2025

(30) Foreign Application Priority Data

Jul. 6, 2023 (KR) ........................ 10-2023-0087776

(51) Int. Cl.
*G01R 31/28* (2006.01)

(52) U.S. Cl.
CPC ..... *G01R 31/2875* (2013.01); *G01R 31/2863* (2013.01); *G01R 31/2879* (2013.01)

(58) Field of Classification Search
CPC ............ G01R 31/2863; G01R 31/2874; G01R 31/2875; G01R 31/2879; G01R 19/0092; G01R 31/2862; G01R 31/2896; G01K 1/024; H05B 1/0202; H05B 1/0233
See application file for complete search history.

(56) References Cited

U.S. PATENT DOCUMENTS

| | | | | |
|---|---|---|---|---|
| 5,568,057 A * | 10/1996 | Kim .................. | G01R 31/2863 324/750.05 |
| 7,042,240 B2 * | 5/2006 | Lopez ................ | G01R 31/2863 374/E1.021 |
| 9,778,313 B2 | 10/2017 | Chen et al. | |
| 10,120,026 B2 | 11/2018 | Kukreja et al. | |
| 11,183,265 B2 * | 11/2021 | Tsai ...................... | G11C 29/06 |

(Continued)

FOREIGN PATENT DOCUMENTS

| | | |
|---|---|---|
| CN | 101315410 B | 10/2012 |
| CN | 111584389 A | 8/2020 |

(Continued)

*Primary Examiner* — Vinh P Nguyen
(74) *Attorney, Agent, or Firm* — Harness, Dickey & Pierce, P.L.C.

(57) ABSTRACT

A test device includes a test board, a connector attached to a lower surface of the test board, a heating device disposed on an upper surface of the test board, the heating device configured to emit heat in response to a signal input through the connector, a temperature sensor disposed on the upper surface of the test board, the temperature sensor configured to measure a temperature of the heating device, and a test socket disposed on the upper surface of the test board, the test socket configured to transmit and receive a signal to and from the heating device and the temperature sensor. Before a test process is performed or after the test process is completed, an internal temperature of a chamber may be verified, thereby improving reliability of the test process.

20 Claims, 10 Drawing Sheets

(56) References Cited

U.S. PATENT DOCUMENTS

| | | | | |
|---|---|---|---|---|
| 11,372,042 | B2 | 6/2022 | Suzuki et al. | |
| 11,493,551 | B2 * | 11/2022 | Ranganathan | G01R 1/0458 |
| 11,500,012 | B2 | 11/2022 | Tsai et al. | |
| 11,614,483 | B2 * | 3/2023 | Yu | G01R 31/2863 324/756.02 |
| 11,693,051 | B1 * | 7/2023 | Jones | G01R 31/2874 324/750.05 |
| 11,940,478 | B2 * | 3/2024 | Franklin | G01R 1/0458 |
| 2008/0091378 | A1 | 4/2008 | Jeong et al. | |
| 2022/0334177 | A1 | 10/2022 | Takeuchi | |

FOREIGN PATENT DOCUMENTS

| | | | | |
|---|---|---|---|---|
| CN | 114994484 | A | | 9/2022 |
| JP | H05-36778 | A | | 2/1993 |
| JP | 2002-131373 | A | | 5/2002 |
| JP | 2005127729 | A | * | 5/2005 |
| JP | 2009-094393 | A | | 4/2009 |
| KR | 10-2008-0033588 | A | | 4/2008 |
| KR | 10-2009-0015335 | A | | 2/2009 |

* cited by examiner

900

920

910

POWER SUPPLY

921

HEATING DEVICE

922

TEMPERATURE SENSOR

930

CONTROLLER

TEST DEVICE AND SEMICONDUCTOR MANUFACTURING APPARATUS INCLUDING TEST DEVICE

CROSS-REFERENCE TO RELATED APPLICATION(S)

This application claims benefit of priority to Korean Patent Application No. 10-2023-0087776 filed on Jul. 6, 2023 in the Korean Intellectual Property Office, the disclosure of which is incorporated herein by reference in its entirety.

BACKGROUND

The present inventive concepts relate to a test device and a semiconductor manufacturing apparatus including the same.

When a semiconductor chip is fabricated at a wafer level and a packaging process is completed, to manufacture a semiconductor package, a test process of inspecting a product by intentionally exposing a semiconductor package to a target temperature may be performed. In such a test process, a chamber may be used to expose a semiconductor package to a target temperature, and whether or not the target temperature is accurately maintained may be an important factor in determining reliability of the test process.

SUMMARY

Some inventive concepts are directed to improve reliability of a test process by mounting a test device including a heating device, a temperature sensor, and a test socket, instead of a semiconductor package, on a test board, and verifying an internal temperature of a chamber in which a test is conducted by measuring a temperature using a temperature sensor while operating the heating device, before or after the test process is completed.

In some example embodiments, there is provided a test device including a test board, a connector attached to a lower surface of the test board, a heating device on an upper surface of the test board, the heating device configured to emit heat in response to a signal input through the connector, a temperature sensor on the upper surface of the test board, the temperature sensor configured to measure a temperature of the heating device, and a test socket on the upper surface of the test board, the test socket configured to transmit and receive a signal to and from the heating device and the temperature sensor.

In some example embodiments there is provided a test layer including a main board, one or more test devices arranged in a first direction, parallel to an upper surface of the main board, and a second direction, orthogonal to the first direction, and a power supply connected to the main board, the power supply configured to apply a voltage to each of the one or more test devices. Each of the one or more test devices may include a test board, a connector attached to a lower surface of the test board, a heating device on an upper surface of the test board, the heating device configured to emit heat in response to a signal input through the connector, a temperature sensor on the upper surface of the test board, the temperature sensor configured to measure a temperature of the heating device, and a test socket on the upper surface of the test board, the test socket configured to transmit and receive a signal to and from the heating device and the temperature sensor. The power supply may include a voltage output circuit configured to apply a voltage to each of the heating devices and a current sensing circuit configured to detect a current determined based on a voltage applied from each of the heating devices, and the power supply may be configured to adjust a voltage applied to at least one of the heating devices based on the current detected by the current sensing circuit.

In some example embodiments, there is provided a semiconductor manufacturing apparatus including a blower through which air is introduced from an external device, a duct configured to receive the air from the blower, a tester configured to conduct a test using the air supplied from the duct and to accommodate at least one test layer to be tested, and a controller connected to the blower, the duct, and the tester to control operations of the blower, the duct, and the tester. The test layer may include a power supply, a main board, and one or more test devices, and each of the one or more test devices may include a temperature sensor, a heating device, and a test socket. The power supply may be configured to supply a voltage to the heating device, the heating device may be configured to emit heat, and the temperature sensor may be configured to measure a temperature of the heating device during a period of time during which the duct supplies the air to the tester. The controller may be configured to convert a result of measuring the temperature into a digital signal and to output temperature distribution information according to positions of the one or more test devices through the digital signal.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, various example embodiments of the present inventive concepts will be described with reference to the accompanying drawings.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

Figure 1:
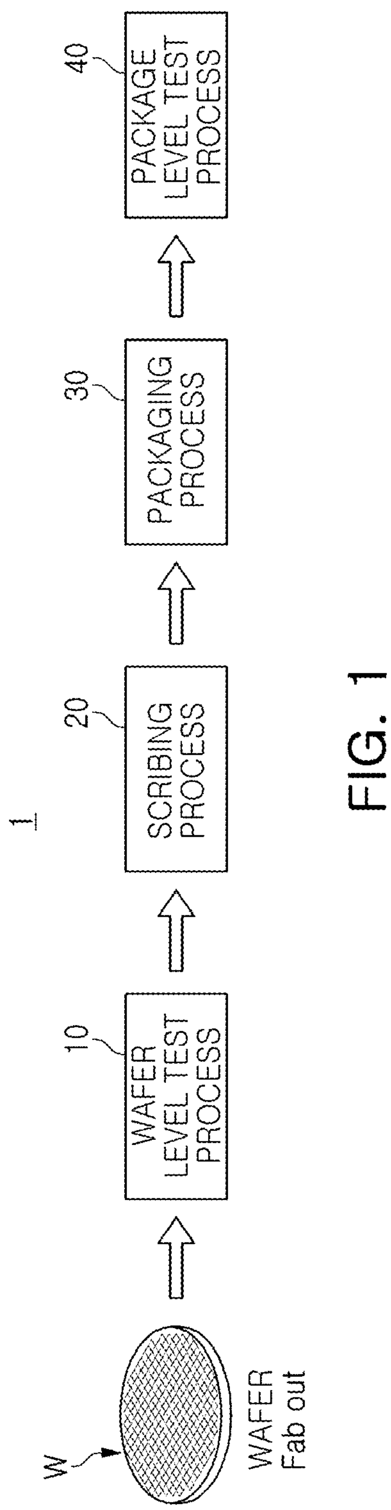
FIG. 1 is a diagram illustrating a process of manufacturing a semiconductor device according to an example embodiment of the present inventive concepts.

FIG. 1 is a diagram illustrating a process of manufacturing a semiconductor device according to an example embodiment of the present inventive concepts.

Referring to FIG. 1, a process of manufacturing a semiconductor device according to an example embodiment may start with manufacturing a plurality of semiconductor dies on a wafer W. As an example, the plurality of semiconductor dies manufactured on the wafer W may provide a single semiconductor device such as a system-on-chip (SOC), an application processor (AP), a graphic processing unit (GPU), a memory device, or the like.

In some example embodiments, when fabrication of the wafer W is completed (fab-out), a test process 10 may be performed on the wafer W at a wafer level. After the wafer level test process 10 is completed, a scribing process 20 may be performed on the wafer W to obtain a plurality of semiconductor dies.

Thereafter, a plurality of semiconductor packages may be obtained by performing a packaging process 30 for the semiconductor dies. The plurality of semiconductor packages may include a process of mounting at least one semiconductor die on a package substrate, a process of connecting a package substrate and a semiconductor die to each other using a wire, or the like.

In some example embodiments, when the packaging process 30 is completed and a plurality of semiconductor packages are manufactured, a test process 40 may be performed on the plurality of semiconductor packages. The package level test process 40 may include a test process of applying stress to a semiconductor package by applying a high voltage to the semiconductor package or exposing semiconductor package to a test environment at a target temperature in order to eliminate a potential defect in the semiconductor package, in addition to a process of identifying whether a normal operation is performed by applying a predetermined (or desired) electrical signal to the semiconductor package.

As an example, the test process may be performed in a state in which semiconductor packages are inserted into a chamber. A test environment, such as a high temperature or a low temperature, may be intentionally set in an internal space of the chamber, and the test environment may be created in which stress, such as extremely low frequency, may be intentionally applied to semiconductor packages. Accordingly, in testing the semiconductor packages, it may be important (or desired) to maintain reliability of the test environment in which the semiconductor packages are exposed. As an example, prior to starting a test, an operation of verifying, in advance, the test environment in which the semiconductor packages are exposed may be performed.

Figure 2:
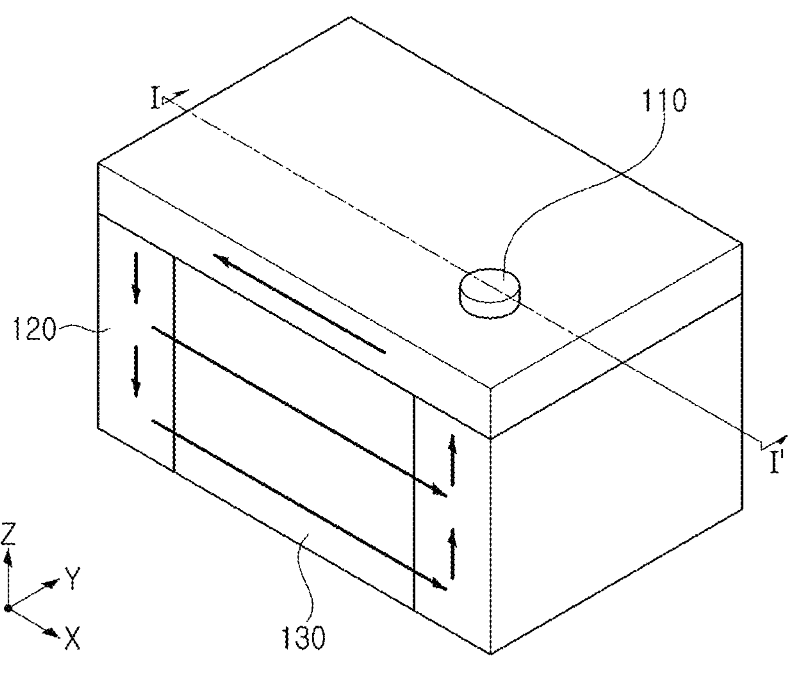
FIG. 2 is a diagram illustrating a semiconductor manufacturing apparatus according to an example embodiment of the present inventive concepts.
Figure 3:
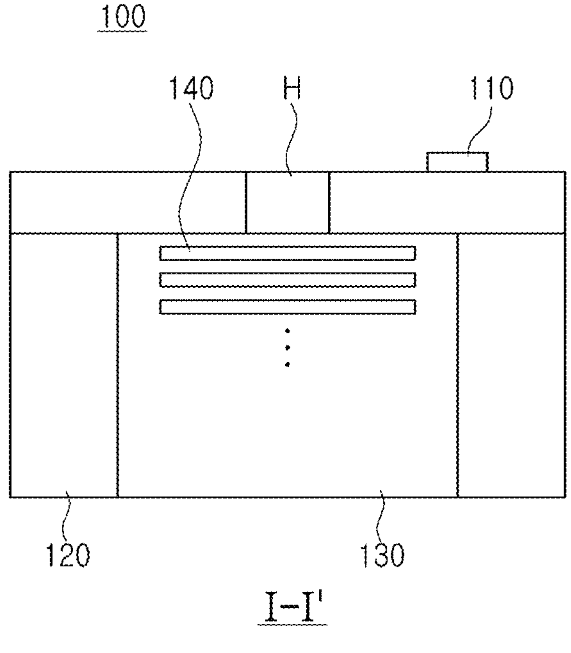
FIG. 3 is a cross-sectional view of the semiconductor manufacturing apparatus according to an example embodiment, illustrated in FIG. 2, in a direction of line I-I'.

FIG. 2 is a diagram illustrating a semiconductor manufacturing apparatus according to an example embodiment of the present inventive concepts. FIG. 3 is a cross-sectional view of the semiconductor manufacturing apparatus according to an example embodiment, illustrated in FIG. 2, in a direction of line I-I'.

A semiconductor manufacturing apparatus 100 according to an example embodiment of the present inventive concepts may be a monitoring burn-in test (MBT) chamber, performing a burn-in test process on a semiconductor package. However, it should be understood that the test process is not limited to the burn-in test. As described above, in order to perform the burn-in test, the semiconductor manufacturing apparatus 100 may intentionally adjust a high-temperature environment in an internal space thereof, and a temperature condition may be changed for each test.

As an example, the semiconductor manufacturing apparatus 100 may create a high-temperature environment for a burn-in test therein, using air heated to a high temperature. For example, the semiconductor manufacturing apparatus 100 may be a convection-type chamber. In some example embodiments, the semiconductor manufacturing apparatus 100 may be a conduction-type chamber or a radiation-type chamber.

In the example embodiment illustrated in FIG. 2, the semiconductor manufacturing apparatus 100 may include a blower 110, a duct 120, and a tester 130. The blower 110 may supply heated air to the duct 120. The duct 120 may supply the heated air to the tester 130. Specifically, referring to FIG. 3, air introduced through the blower 110 may be heated while passing through a heating element H. The tester 130 may perform a test by simultaneously exposing semiconductor packages to a high-temperature environment using the heated air supplied from the duct 120. In addition, at least one test layer to be tested may be accommodated.

A controller, controlling operations of the blower 110, the duct 120, and the tester 130, may be included in the semiconductor manufacturing apparatus 100. The controller may convert a result of measuring a temperature into a digital signal and output temperature distribution information according to positions of test devices through the digital signal.

As described above, in a semiconductor process test such as a burn-in test, whether a defect is present may be determined by intentionally exposing semiconductor packages to a target temperature and applying stress thereto. As an example, in order to increase reliability of a test, it may be beneficial (or advantageous) to verify whether a temperature environment provided by air supplied to the semiconductor packages from the semiconductor manufacturing apparatus 100 is appropriate. For example, it may be beneficial (or advantageous) to calibrate whether a temperature of air generated by the semiconductor manufacturing apparatus 100 is appropriate and whether wind speed in a process of supplying air is appropriate.

In an example embodiment of the present inventive concepts, unlike a test process performed on semiconductor packages produced in an actual mass production process, amounts of heat emitted by the semiconductor packages themselves may be set to have the same value to optimize settings of the semiconductor manufacturing apparatus 100. In order to calibrate the semiconductor manufacturing apparatus 100 in an environment in which all semiconductor packages emit the same amount of heat, test devices that may be inserted into the semiconductor manufacturing apparatus 100, instead of the semiconductor packages, may be used in an example embodiment of the present inventive concepts.

In the example embodiment illustrated in FIG. 3, a test device may be inserted into the tester 130 of the semiconductor manufacturing apparatus 100 in the form of a test layer 140. At least one test layer 140 may be inserted into the tester 130.

The test device may include a heating device, a temperature sensor, and a test socket. In some example embodiments, when the test devices are inserted into the semiconductor manufacturing apparatus 100, the same voltage value may be applied to the heating device to create an environment in which the semiconductor packages themselves emit the same amount of heat. As an example, the temperature sensor may be disposed on an upper surface of the heating device. In this case, the temperature sensor may measure a surface temperature of the upper surface of the heating device. A result of measuring the temperature may be used to analyze whether a temperature set in the semiconductor manufacturing apparatus reaches a target temperature, whether a speed and an amount of wind are appropriate, or whether a structure of the semiconductor manufacturing apparatus is appropriate. The test device may be used in such a manner as to optimize temperature settings or the like beneficial (or advantageous) for performing a burn-in test by inserting the semiconductor packages into the semiconductor manufacturing apparatus 100.

In an example embodiment, the temperature sensor included in the test device may measure a temperature of the heating device included in the test device in real time, and information on the measured temperature may be converted into a digital signal by the temperature sensor or the controller connected to the temperature sensor.

Figure 4:
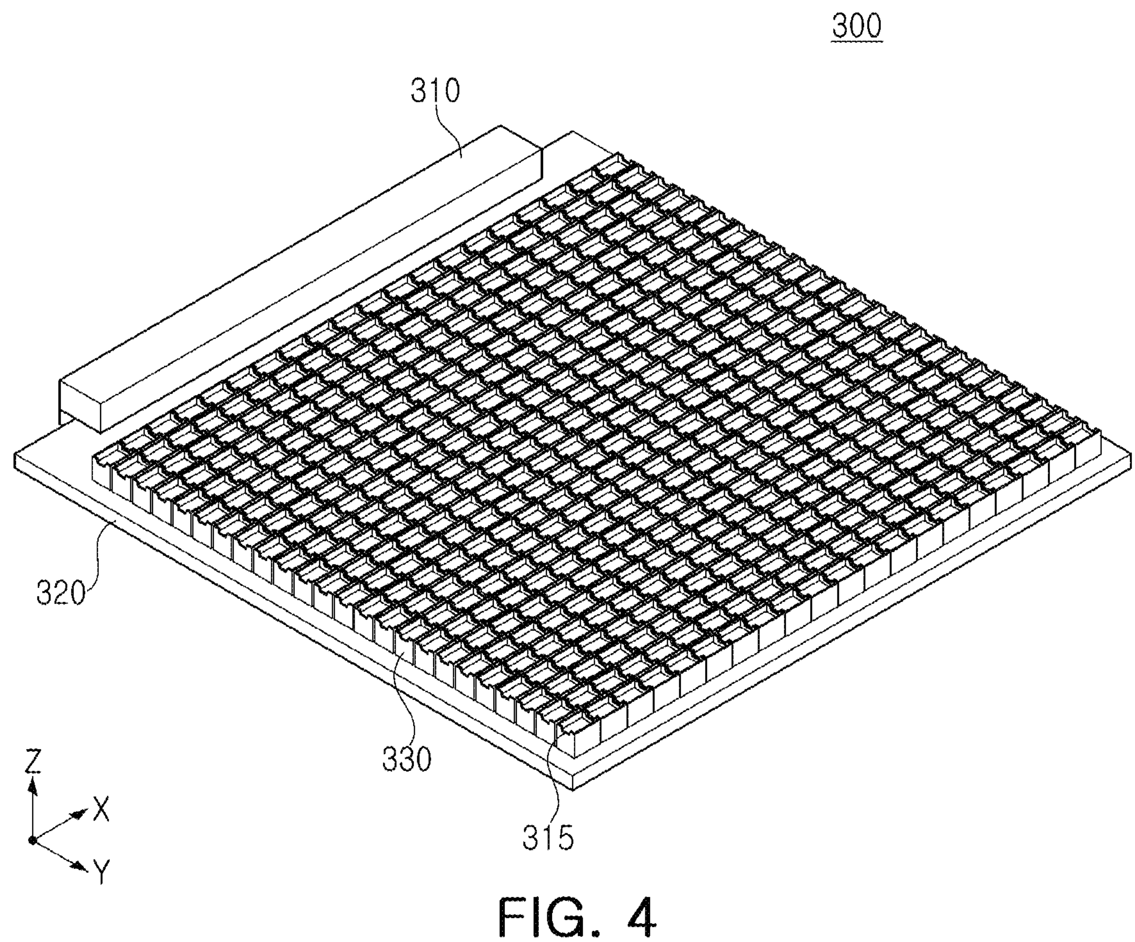
FIG. 4 is a diagram illustrating a test layer of a semiconductor manufacturing apparatus according to an example embodiment of the present inventive concepts.
Figure 5:
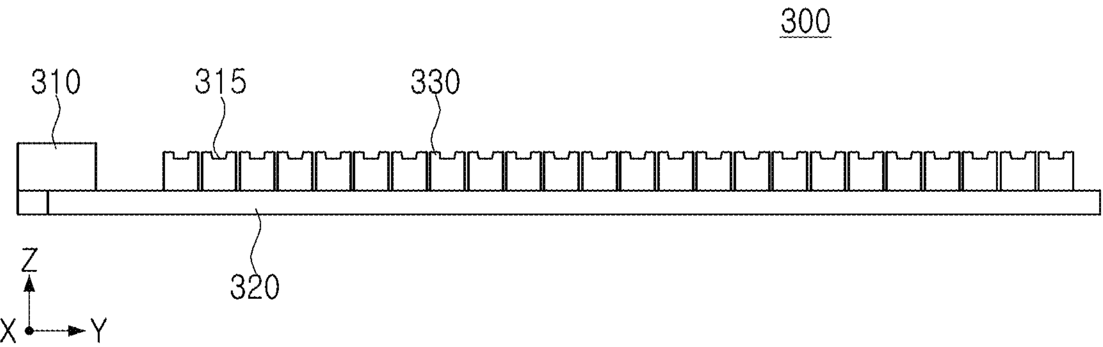
FIG. 5 is a plan view of a side surface of a test layer of the semiconductor manufacturing apparatus according to an example embodiment, illustrated in FIG. 4.

FIG. 4 is a diagram illustrating a test layer of a semiconductor manufacturing apparatus according to an example embodiment of the present inventive concepts. FIG. 5 is a plan view of a side surface of a test layer of the semiconductor manufacturing apparatus according to an example embodiment, illustrated in FIG. 4.

A test layer 300 according to an example embodiment described with reference to FIGS. 4 and 5 may be accommodated in a tester mounted in a semiconductor manufacturing apparatus. As an example, referring to FIG. 3 together, at least one test layer 300 may be accommodated in the tester 130 of the semiconductor manufacturing apparatus 100. The test layer 300 may include a power supply 310, a main board 320, and test devices 330.

Each of the test devices 330 may include a test board, a connector, a heating device, a temperature sensor, and a test socket, but example embodiments are not limited thereto. A connector may be attached to a lower surface of the test board, and may be connected to a main board. The heating device and the temperature sensor may be disposed on an upper surface of the test board. As an example, the temperature sensor may be attached to the heating device. The heating device may emit heat in response to a signal input through the connector, and the temperature sensor may measure a temperature of the heating device. The test socket may be disposed on the upper surface of the test board, and may transmit and receive a signal to and from the heating device and the temperature sensor. Components of each of the test devices will be described below.

The power supply 310 may apply a voltage to the heating devices included in the test devices 330 to control the heating devices to emit heat. The power supply 310 may include a current sensing circuit, detecting a current from each of the heating devices, in addition to a voltage output circuit, applying a voltage to each of the heating devices. The power supply 310 may adjust, based on the current detected by the current sensing circuit, a voltage applied to at least one of the heating devices. In an example embodiment, the power supply 310 may increase the voltage applied to the heating devices, when the current detected by the current sensing circuit is lower than a preset current, and may reduce the voltage applied to the heating devices, when the current detected by the current sensing circuit is higher than the preset current.

In an example embodiment of the present inventive concepts, the power supply 310 may apply different voltages to at least some test devices, among the test devices 330. In an example embodiment, referring to FIG. 4, the test devices 330 may be arranged in a first direction (Y-axis direction in FIG. 4) and a second direction (X-axis direction in FIG. 4), parallel to an upper surface of the main board 320. The power supply 310 may apply a higher voltage to the test device 330 positioned to be distant therefrom in the first direction than to the test device 330 positioned to be close thereto in the first direction.

Referring to FIG. 5, as the test device 330 is disposed to be farther from the power supply 310 in a first direction (Y-axis direction in FIG. 5), a resistance value between the power supply 310 and a heating device may increase. Accordingly, assuming that the power supply 310 supplies the same voltage, a temperature of a heating device included in the test device 330, close to the power supply 310, may be higher than that of a heating device included in the test device 330, relatively far from the power supply 310. In an example embodiment of the present inventive concepts, the power supply 310 may include a voltage compensation circuit, and the voltage compensation circuit may set a magnitude of a voltage output to each of the test devices 330 differently depending on a distance from the power supply 310. Accordingly, in some example embodiments, when it is desired to set each of the test devices 330 to have a predetermined (or desired) amount of heat emitted, a higher voltage may be applied to a heating device disposed to be farther from the power supply 310 than to a heating device disposed to be closer to the power supply 310.

In the example embodiment illustrated in FIG. 4, it is illustrated that 480 test devices 330 are mounted on one test layer 300, but the number of test devices 330 may vary in some example embodiments. In addition, in the example embodiment illustrated in FIG. 4, it is assumed that the test devices 330 are arranged in the form of a matrix in a first direction and a second direction, but an arrangement of the test devices 330 may also vary.

In an example embodiment, a test socket included in each of the test devices 330 may have at least one surface in which a groove 315 is formed, and an amount of air introduced into the test socket may vary depending on a size and shape of the groove 315. In addition, grooves 315, having different sizes and shapes, may be formed in test sockets included in at least some test devices, among the test devices 330. A size and shape of a groove 315 formed in the test socket may be changed in such a manner, thereby adjusting a flow rate and a flow speed of heated air, introduced into a test socket.

A temperature sensor may measure a temperature of a heating device in real time, thereby accurately calibrating a preset temperature of a semiconductor manufacturing apparatus and a structure of the semiconductor manufacturing apparatus before or after a test process is performed without additional manpower placement.

In some example embodiments, when the test devices 330 are disposed on the test layer 300, the power supply 310 may apply a voltage to the test devices 330 to operate a heating device included in each of the test devices 330. As an example, while the heating device operates to emit heat, heated air may be supplied to the test layer, and a temperature sensor of each of the test devices 330 may be used to measure a temperature of the heating device.

The temperature sensor may measure the temperature of the heating device and output temperature information at predetermined (or desired) intervals. As an example, the temperature sensor may output temperature information, determined depending on the temperature of the heating device, in a format of analog data or digital data, and may determine, based on the data, a temperature distribution of the test devices 330 disposed on the test layer 300. Accordingly, in some example embodiments, an internal temperature of the semiconductor manufacturing apparatus in which the test layer 300 is accommodated may be accurately calibrated in advance before or after a test process is actually performed on a semiconductor package.

Figure 6:
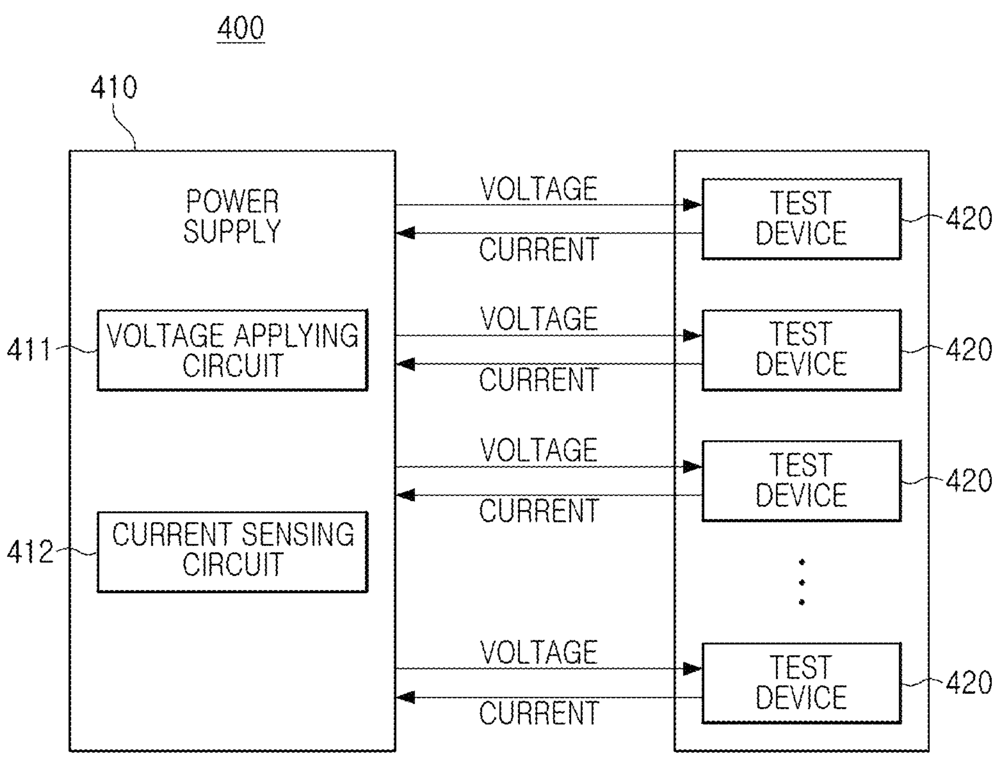
FIG. 6 is a schematic block diagram illustrating a test layer according to an example embodiment of the present inventive concepts.

FIG. 6 is a schematic block diagram illustrating a test layer according to an example embodiment of the present inventive concepts.

In an example embodiment, a test layer may include one power supply 410 and one or more test devices 420. The power supply 410 may include a voltage applying circuit 411 and a current sensing circuit 412.

The voltage applying circuit 411 may apply a preset voltage to each of the test devices 420. A current may flow in a heating device included in each of the test devices 420 by the applied voltage, and each of the test devices 420 may transmit, to the power supply 410, information on the current flowing through the heating device. The current sensing circuit 412, included in the power supply 410, may receive the current information from the test device 420.

The power supply 410 may transmit the received current information to a controller of a semiconductor manufacturing apparatus, and the controller may increase or reduce, based on the current information, an output voltage of the power supply 410. However, in some example embodiments, the circuit included in the power supply 410 may adjust a voltage output by the voltage applying circuit 411 depending on the current information without intervention of the controller.

Figure 7:
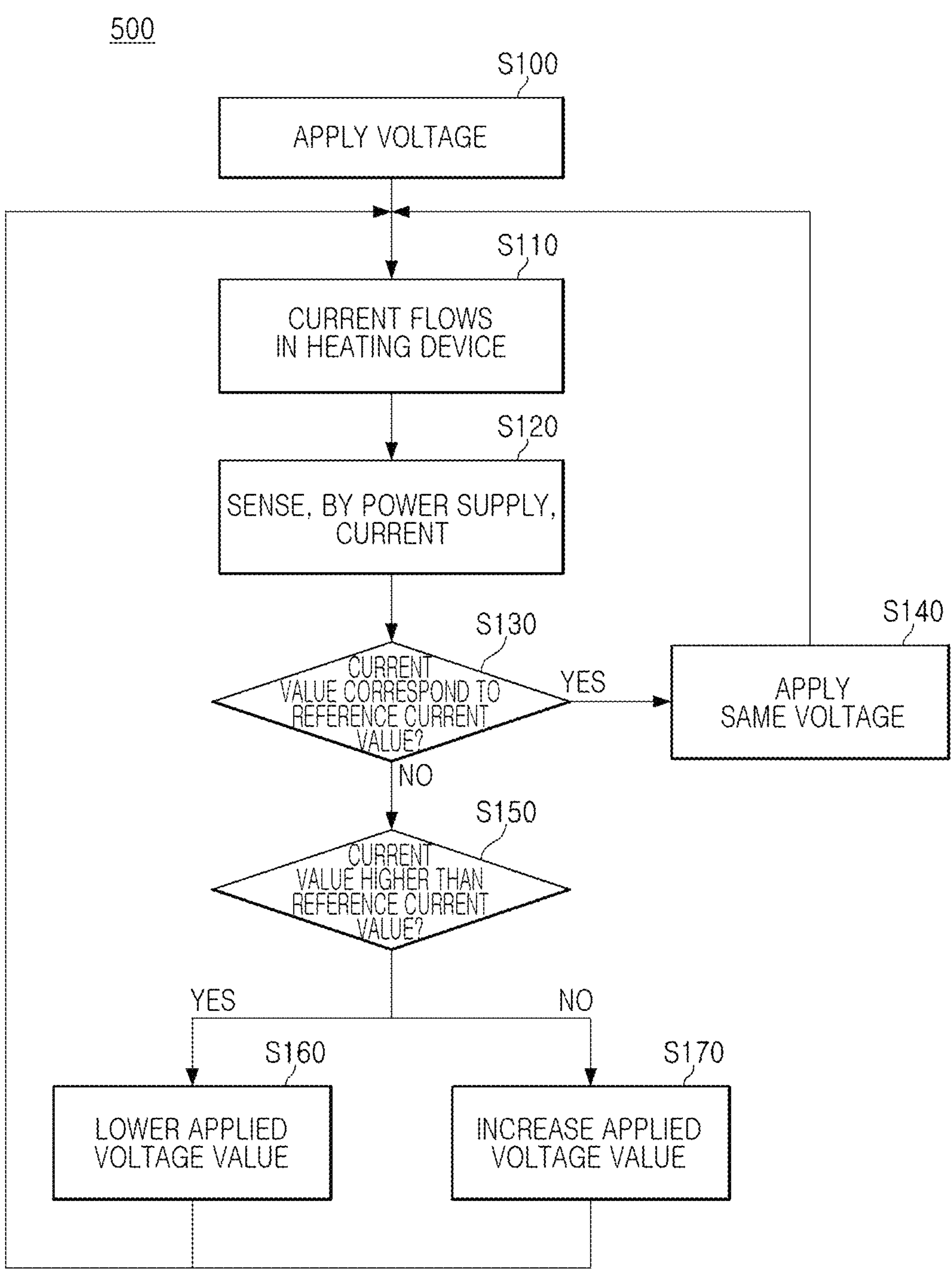
FIG. 7 is a schematic flowchart illustrating driving of a feedback circuit according to an example embodiment of the present inventive concepts.

FIG. 7 is a schematic flowchart illustrating driving of a feedback circuit according to an example embodiment of the present inventive concepts. In an example embodiment, driving of the feedback circuit described with reference to FIG. 7 may be executed in a main board included in a test layer or a test board included in a test device.

Referring to FIG. 7, a power supply included in the test layer may apply a voltage to a test device (S100). Specifically, the voltage may be applied to a heating device included in the test device. A current may flow in the heating device to which the voltage is applied (S110), and information on the current, flowing in the heating device, may be sensed by the power supply again (S120).

In an example embodiment, the power supply may determine whether a current value, among the received current information, corresponds to a preset reference current value (S130). As an example, when the current value sensed by the power supply corresponds to the reference current value, the same voltage value applied to the heating device may be maintained (S140). Alternatively, when the current value sensed by the power supply does not correspond to the reference current value, the applied voltage value may be changed (S150).

In an example embodiment, when the current value sensed by the power supply is higher than the reference current value, the voltage value applied to the test device may be lowered (S160). When the current value sensed by the power supply is lower than the reference current value, the voltage value applied to the test device may be increased (S170). Thus, the changed voltage may be applied to the heating device, and a current value flowing in the heating device may be changed (S110). The power supply may re-sense a value of the current flowing in the heating device and compare the value with the reference current value (S120 and S130).

A feedback circuit may be driven in such a manner, thereby maintaining the same amount of heat emitted by each of heating devices. For example, it is possible to simulate actual heating properties of a semiconductor package, which is a target of a test process. Accordingly, in some example embodiments, an internal temperature distribution of a semiconductor manufacturing apparatus in which the test process is performed may be accurately measured in advance, and the test process may be controlled based thereon, thereby improving reliability of the test process.

For example, in a similar manner to a semiconductor package emitting heat by receiving a voltage beneficial (or advantageous) for an operation in the test process, a temperature distribution according to a position of a test layer may be identified in advance using test devices including a heating device emitting heat by receiving a voltage. The temperature distribution identified in advance in such a manner may be used to set a temperature and wind speed of air supplied to a test layer on which semiconductor packages are mounted in an actual test process, thereby improving reliability of the test process.

Figure 8:
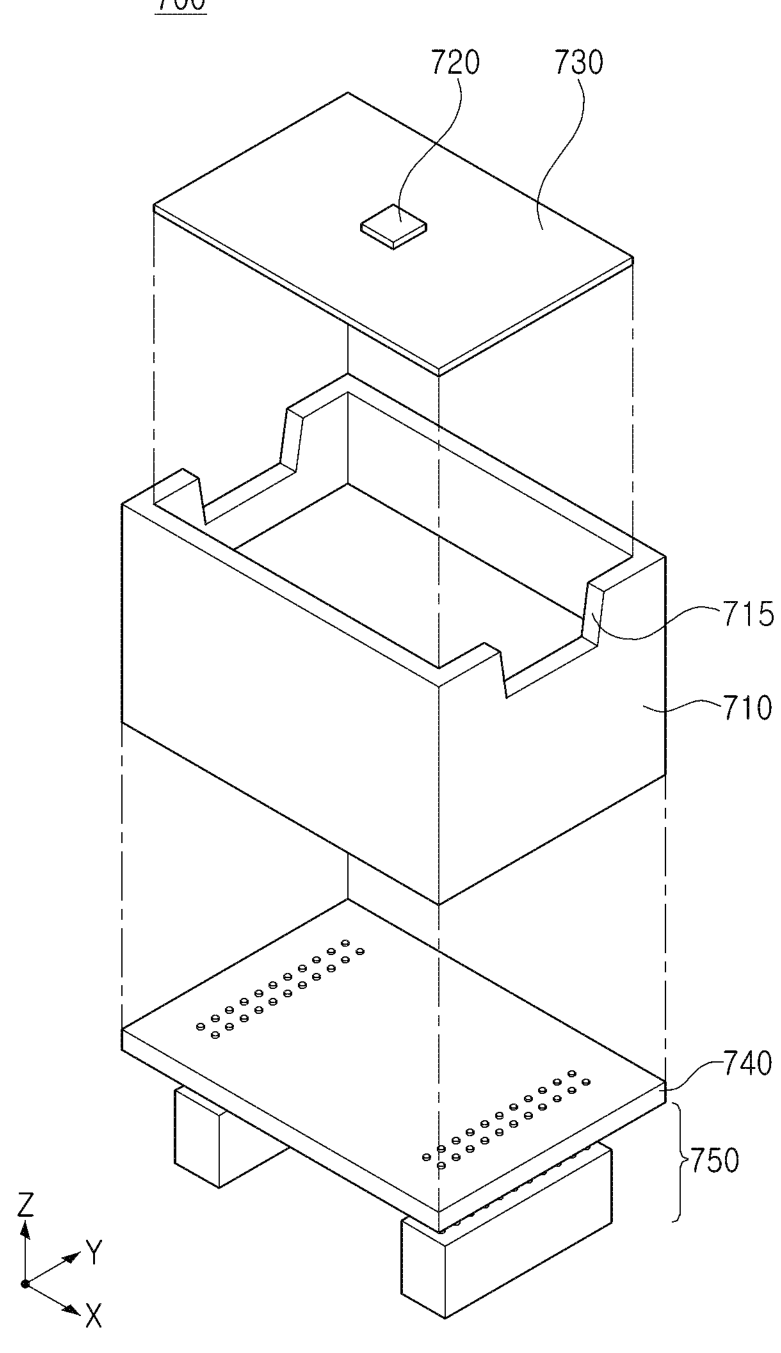
FIG. 8 is an exploded view of a test device according to an example embodiment of the present inventive concepts.
Figure 9A:
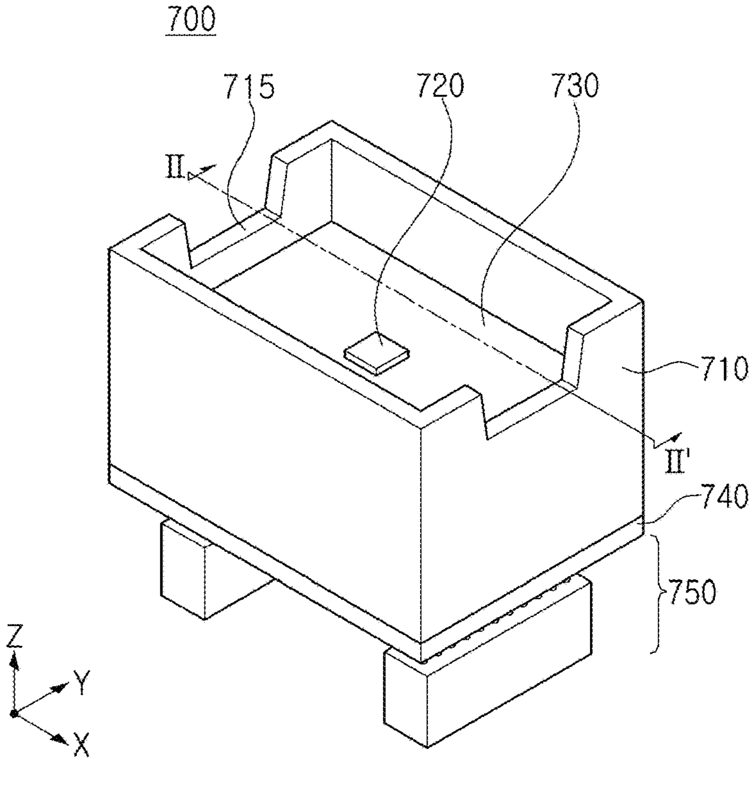
FIGS. 9A and 9B are assembly views of the test device according to an example embodiment, illustrated in FIG. 8.
Figure 9B:
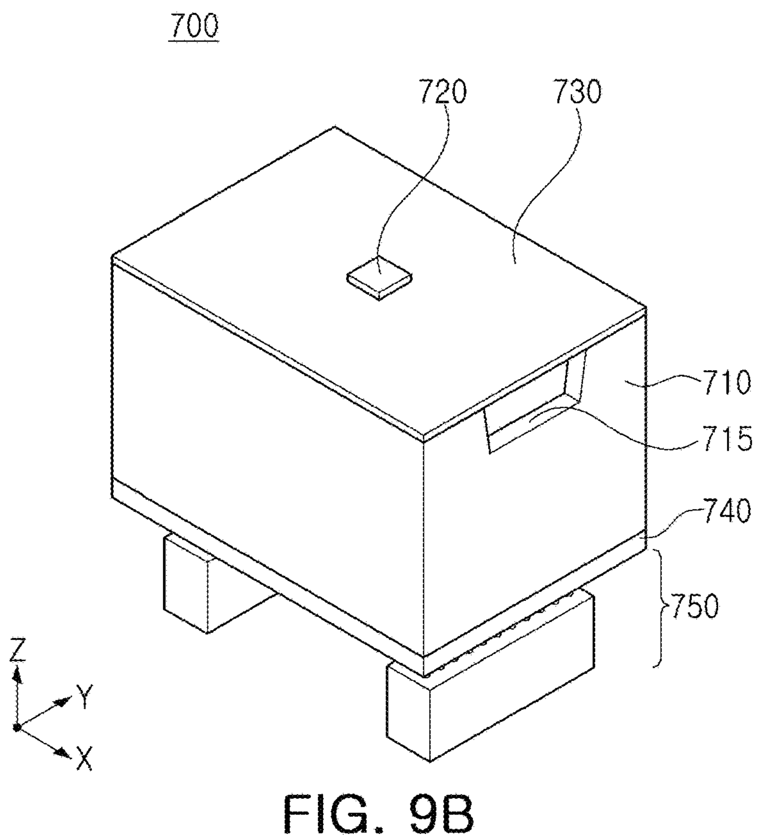

FIG. 8 is an exploded view of a test device according to an example embodiment of the present inventive concepts. FIGS. 9A and 9B are assembly views of the test device according to an example embodiment, illustrated in FIG. 8.

Referring to FIG. 8, a test device 700 according to an example embodiment of the present inventive concepts may include a test socket 710, a temperature sensor 720, a heating device 730, a test board 740, and a connector 750.

The connector 750 may be attached to a lower surface of the test board 740, and may be connected to a main board. In an example embodiment, the heating device 730 and the temperature sensor 720 may be disposed on an upper surface of the test board 740. The heating device 730 may emit heat in response to a signal input through the connector 750, and the temperature sensor 720 may measure a temperature of the heating device 730. The test socket 710 may be disposed on the upper surface of the test board 740, and may transmit and receive a signal to and from the heating device 730 and the temperature sensor 720.

In the example embodiment illustrated in FIG. 8, an area of the temperature sensor 720 may be smaller than that of the heating device 730, and the area of the heating device 730 may be equal to or smaller than the area of the test socket 710. In addition, in an example embodiment, the temperature sensor 720 may be disposed on an upper surface or a lower surface of the heating device 730. For example, the heating device 730 and the temperature sensor 720 may be disposed in a direction, perpendicular to an upper surface of the test board 740 (Z-axis direction in FIG. 8). When the temperature sensor 720 is disposed on the upper surface of the heating device 730, the temperature sensor 720 may measure a surface temperature of the upper surface of the heating device 730. Alternatively, when the temperature sensor 720 is disposed on the lower surface of the heating device 730, the temperature sensor 720 may measure a surface temperature of the lower surface of the heating device 730.

In an example embodiment, the test socket 710 may have at least one surface in which a groove 715 is formed, and an amount of air introduced into the test socket may vary depending on a size and shape of the groove 715. A size and shape of a groove 715 formed in the test socket 710 may be changed in such a manner, thereby adjusting a flow rate and a flow speed of heated air, introduced into the test socket.

The test device 700 may include at least one thermal resistor. The thermal resistor may be formed of a metal material such as aluminum or copper, or may be formed of a non-metal material such as epoxy. The thermal resistor may perform a role of adding resistance beneficial (or advantageous) for the heating device 730 to achieve a target temperature. In an example embodiment, at least one of the heating device 730, the temperature sensor 720, the test socket 740, and the thermal resistor may be attachable to and detachable from the test board 740.

Referring to FIG. 9A, an internal structure of the test socket 710, having a predetermined (or desired) height, may be present in the test socket 710. The temperature sensor 720 and the heating device 730 may be disposed on an upper surface of the internal structure of the test socket 710. For example, the test socket 710 may be formed to surround the temperature sensor 720 and the heating device 730. As in the example embodiment illustrated in FIG. 9A, the temperature sensor 720 may be disposed on an upper surface of the heating device 710 to measure a surface temperature of the upper surface of the heating device 710. An area of the heating device 710 may be smaller than that of the test socket 710.

Referring to FIG. 9B, the temperature sensor 720 and the heating device 730 may be disposed on the test socket 710. For example, the test socket 710, the heating device 730, and the temperature sensor 720 may be stacked in a Z-axis of FIG. 9B without overlapping each other. As in the example embodiment illustrated in FIG. 9A, the temperature sensor 720 may be disposed on an upper surface of the heating device 710 to measure a surface temperature of the upper surface of the heating device 710. An area of the heating device 710 may be equal to that of the test socket 710.

The heating device 730 may simulate actual heating properties of a semiconductor package, which is a target of a test process. In an example embodiment of the present inventive concepts, before a test process is actually performed on a semiconductor package, the heating device 730 and the temperature sensor 720 may be mounted on the test board 740, and the heating device 730 may be controlled to emit heat instead of the semiconductor package. Accordingly, in some example embodiments, an internal temperature distribution of a semiconductor manufacturing apparatus in which the test process is performed may be accurately measured, thereby improving reliability of the test process based thereon.

Figure 10:
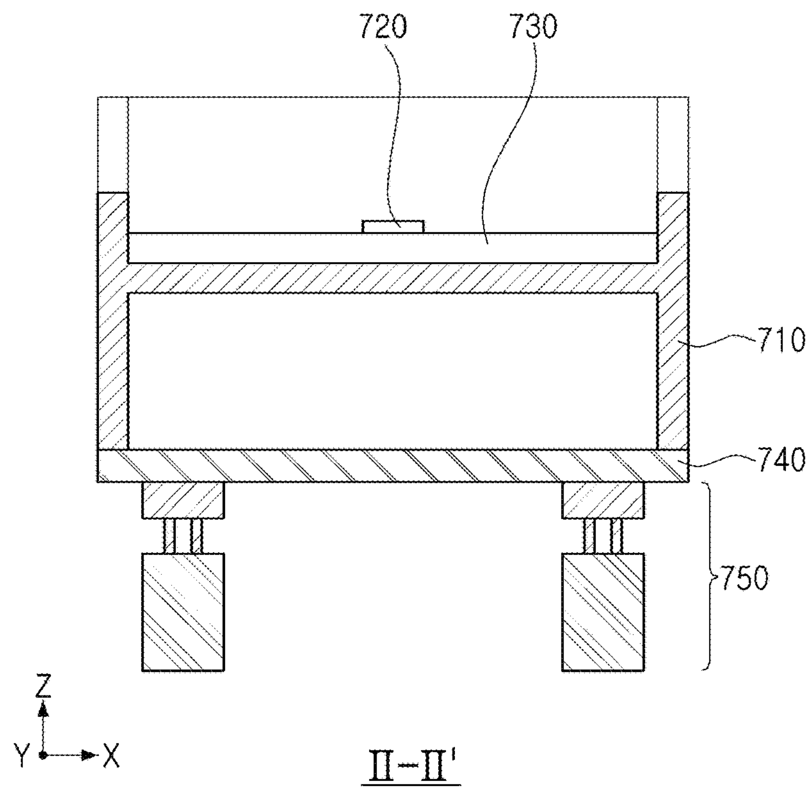
FIG. 10 is a cross-sectional view of the test device according to an example embodiment, illustrated in FIG. 9A, in a direction of line II-II'.

FIG. 10 is a cross-sectional view of the test device according to an example embodiment, illustrated in FIG. 9A, in a direction of line II-II'.

A test device 700 may include a test socket 710, a temperature sensor 720, a heating device 730, a test board 740, and a connector 750.

An upper surface of the test socket 710 may have an area equal to that of an upper surface of the test board 740. The test socket 710 may be disposed on the upper surface of the test board 740, and may include an internal structure having a predetermined (or desired) height. The height of the internal structure may be different from that illustrated in FIG. 10. The test socket 710 may be fixed to the upper surface of the test board 740 or may be attachable to and detachable from the upper surface of the test board 740.

As an example, the temperature sensor 720 and the heating device 730 may be stacked in a Z-axis direction of FIG. 10, and may be surrounded by the test socket 710. In the example embodiment illustrated in FIG. 10, the temperature sensor 720 may be disposed on the upper surface of the test board 740, and the temperature sensor 720 may measure a surface temperature of an upper surface of the heating device 730. Unlike illustrated, the temperature sensor 720 may be disposed on a lower surface of the heating device 730. In this case, the temperature sensor 720 may measure a surface temperature of the lower surface of the heating device 730. Each of the temperature sensor 720 and the heating device 730 may be fixed or may be attachable or detachable.

In an example embodiment, the test board 740 may include a circuit, compensating a voltage applied by a power supply to each of the heating devices 730. Accordingly, in some example embodiments, the voltage applied to each of the heating devices 730 may be varied, thereby maintaining the same amount of heat emitted from each of the heating devices 730. Thus, reliability of the amount of heat emitted may be secured.

As an example, the connector 750 may be fixedly connected to a lower surface of the test board 740 to fix the test board 740 and a main board. The connector 750 may be a connector, providing electrical connection between the test board 740 and the main board.

Figure 11:
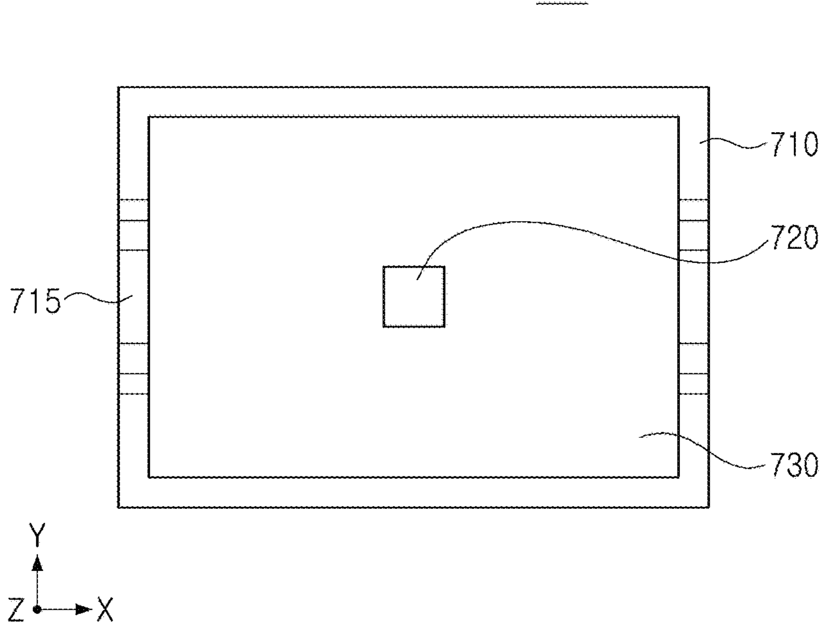
FIG. 11 is a top plan view of the test device according to an example embodiment, illustrated in FIG. 9A.

FIG. 11 is a top plan view of the test device according to an example embodiment, illustrated in FIG. 9A.

A test device 700 may include a test socket 710, a temperature sensor 720, a heating device 730, and a test board 740.

The test board 740 may have a rectangular shape as illustrated, but may have a shape different from the rectangular shape. A portion of the test board 740 may overlap the test socket 710 and the heating device 730, and accordingly, there may be a region, invisible from an upper surface of the test board 740.

As illustrated in FIG. 11, the test socket 710 may have a size the same as that of the test board 740, but may have a size smaller than that of the test board 740 and larger than that of the heating device 730. The test socket 710 may have a rectangular shape the same as that of the test board 740 as illustrated, but may have a shape different from the rectangular shape.

A size of the temperature sensor 720 may be smaller than that of the heating device 730. A portion of the heating device 730 may overlap the temperature sensor 720, and accordingly, there may be a region, invisible from an upper surface of the heating device 730.

Figures 12, 13:
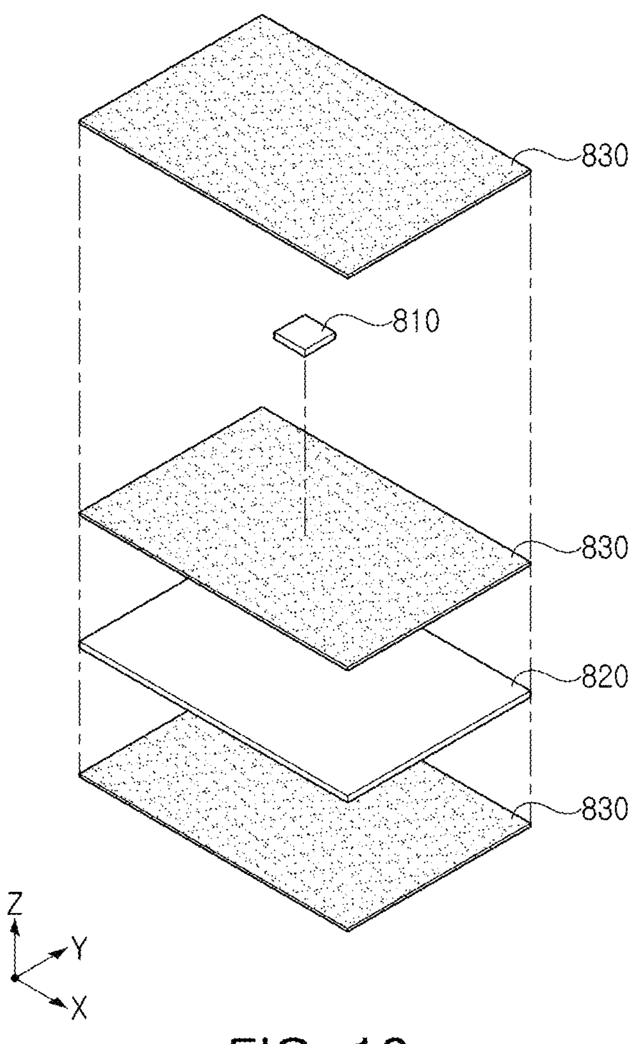
FIG. 12 is a diagram illustrating an arrangement of a heating device, a temperature sensor, and a heat resistor according to an example embodiment of the present inventive concepts.
FIG. 13 is a schematic block diagram illustrating a test system according to an example embodiment of the present inventive concepts.

FIG. 12 is a diagram illustrating an arrangement of a heating device, a temperature sensor, and a heat resistor according to an example embodiment of the present inventive concepts. A test device includes a temperature sensor 810 and a heating device 820, and may include, for example, at least one thermal resistor 830. The thermal resistor may be formed of a metal material such as aluminum or copper, or may be formed of a non-metal material such as epoxy. The thermal resistor may perform a role of adding resistance beneficial (or advantageous) for the heating device 820 to achieve a target temperature.

As in the example embodiment illustrated in FIG. 12, when the temperature sensor 810 is disposed on an upper surface of the heating device 820, the thermal resistor 830 may be disposed on an upper surface of the temperature sensor 810. Alternatively, in some example embodiments, the thermal resistor 830 may be disposed between the temperature sensor 810 and the heating device 820 or may be disposed on a lower surface of the heating device 820. The test device may further include at least one thermal resistor 830 in the above-described positions depending on a degree to which the target temperature is achieved.

An area of the thermal resistor 830 may be equal to or smaller than that of the heating device 820. As in the example embodiment illustrated in FIG. 12, the thermal resistor 830 may have a shape the same as that of the heating device 820. However, it should be noted that a shape and thickness of the thermal resistor 830 are not limited thereto. The thickness of the thermal resistor 830 may be smaller than that of the heating device 820, but it should be noted that the present inventive concepts are not limited thereto.

At least one of the heating device 820, the temperature sensor 810, the test socket, and the thermal resistor 830 may be attachable to and detachable from the test board.

FIG. 13 is a schematic block diagram illustrating a test system according to an example embodiment of the present inventive concepts.

A test system according to an example embodiment may include a power supply 910, a test device 920, and a controller 930. The test device 920 may include a heating device 921 and a temperature sensor 922.

The power supply 910 may apply a voltage to each of the heating devices 921 included in the test device, and at least one of the applied voltage values may have a different value. In an example embodiment, a current may flow in each of the heating devices 921 by the voltage applied by the power supply 910. Thus, each of the heating devices 921 may emit heat by the flowing current.

In an example embodiment, the temperature sensor 922, positioned on an upper surface of the heating device 921, may measure a surface temperature of the upper surface of the heating device 921. The temperature sensor 922 may transmit information on the measured temperature to the controller 930 included in a semiconductor manufacturing apparatus.

In an example embodiment, the controller 930 may convert the temperature information received from the temperature sensor 922 into a digital signal. In addition, the controller 930 may transmit, to a user, the temperature information converted into a digital signal, such that the user may process the temperature information into a desired form.

The heating device 921 may simulate actual heating properties of a semiconductor package, which is a target of a test process. In an example embodiment of the present inventive concepts, before a test process is actually performed on a semiconductor package, the heating device 921 may be controlled to emit heat instead of the semiconductor package. Accordingly, in some example embodiments, an internal temperature distribution of a semiconductor manufacturing apparatus in which the test process is performed may be accurately measured in advance, and the test process may be controlled based thereon, thereby improving reliability of the test process.

Figure 14:
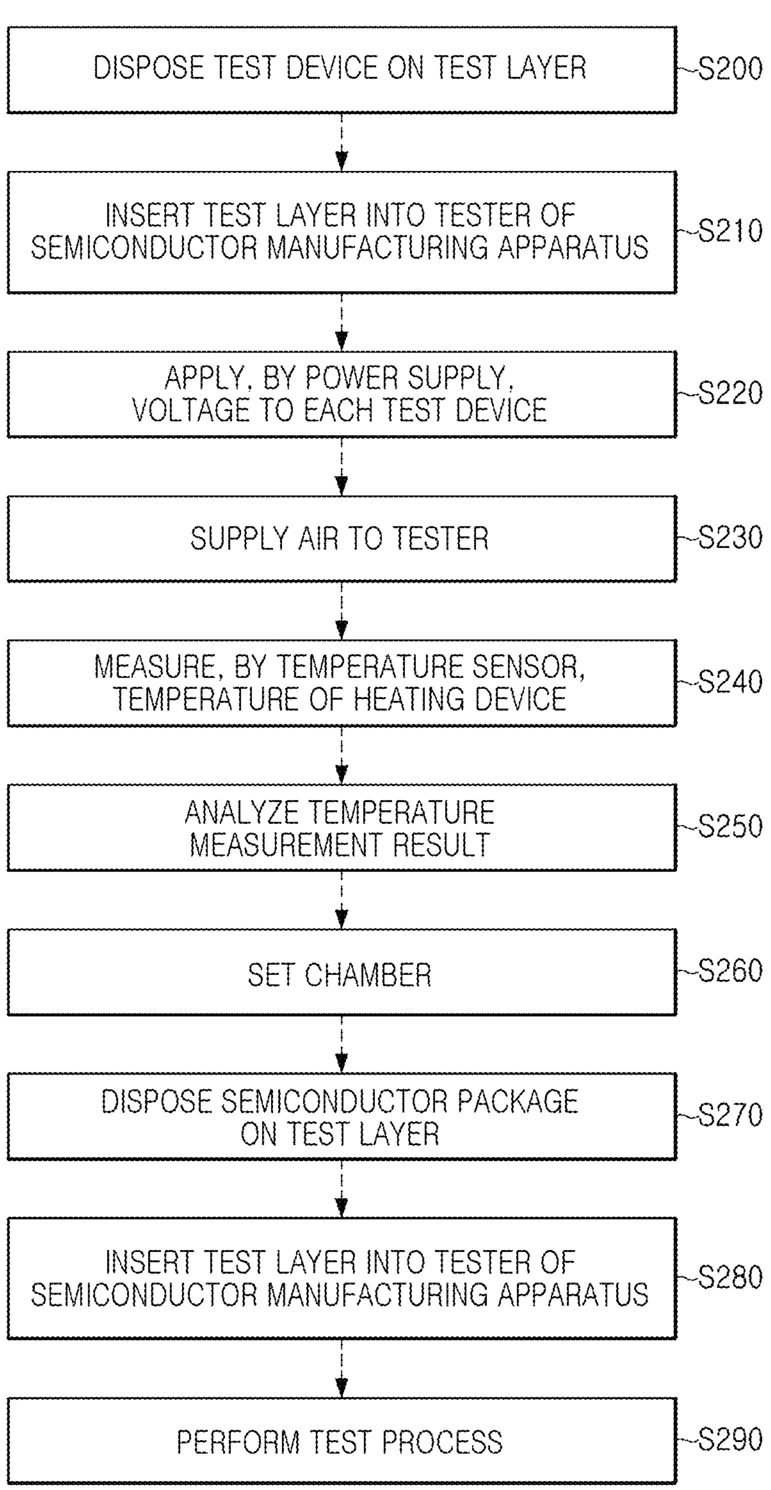
FIG. 14 is a flowchart illustrating a package level test process according to an example embodiment of the present inventive concepts.

FIG. 14 is a flowchart illustrating a package level test process according to an example embodiment of the present inventive concepts.

As described above, a semiconductor manufacturing apparatus may be a convection-type chamber used for a burn-in test process. A test layer may be inserted into the semiconductor manufacturing apparatus, and a test device may be disposed on an upper surface of a main board included in the test layer.

The test layer may include a power supply and a main board, and one or more test devices may be disposed on an upper surface of the main board (S200). In an example embodiment of the present inventive concepts, the test devices described above may be disposed in a first direction and a second direction of the test layer, as in the example embodiment illustrated in FIG. 4. As described above with reference to FIG. 8, each of the test devices may include a heating device, a temperature sensor, and a test socket, but example embodiments are not limited thereto.

The semiconductor manufacturing apparatus may be divided into a blower, a duct, and a tester, and the test layer may be inserted into the tester of the semiconductor manufacturing apparatus (S210). In this case, as in the example embodiment described above with reference to FIG. 3, at least one test layer may be inserted into the tester.

A power supply included in the test layer may apply a voltage to each of the test devices (S220). A feedback circuit may be applied to each of the test devices. As described above with reference to FIG. 6, the power supply may include a voltage applying circuit and a current sensing circuit, but example embodiments are not limited thereto. The voltage applying circuit of the power supply may apply a voltage to each of the test devices, and the current sensing circuit of the power supply may receive current information transmitted by each of the test devices.

In order to maintain the same amount of heat emitted by the heating devices of the test devices, the feedback circuit may be applied to each of the heating device as described above in FIG. 7. For example, the voltage applying circuit may apply different voltages to at least some test devices, among the test devices. As an example, the voltage applying circuit may apply a higher voltage to a test device positioned to be farther from the power supply.

The blower of the semiconductor manufacturing apparatus may supply air to the tester through the duct (S230). In this case, a temperature of the air may be set to a target temperature in a test. The temperature sensors included in the test devices may measure a temperature of the heating devices, respectively (S240). After the supply of high-temperature air is terminated, a temperature measurement result may be analyzed (S250). As an example, an analysis result may be a temperature distribution according to a position of the test layer.

A chamber may be set with reference to an analysis result such as a temperature distribution (S260). In an example embodiment, in an actual test process, settings such as a temperature and wind speed of air supplied to a test layer on which semiconductor packages are mounted, settings such as the number of semiconductor packages and an arrangement of the semiconductor packages, and settings of a structure and shape of a semiconductor manufacturing device may be optimized, thereby improving reliability of the test process.

After the above process, a test device disposed on the test layer may be removed, and then a semiconductor package to be subject to a package level test process may be disposed on the test layer (S270). The test layer on which the semiconductor package is disposed may be inserted into the tester of the semiconductor manufacturing apparatus (S280). Thereafter, under the optimized settings, the test process may be performed on the semiconductor package (S290).

According to an example embodiment of the present inventive concepts, before a test process is performed by mounting semiconductor packages to be tested on each of test boards included in a chamber, a test device including a heating device and a temperature sensor may be mounted on a test board, and temperature may be measured using the temperature sensor while operating the heating device. Thus, before the test process is started, a temperature distribution expected to occur under a condition under which a test is performed on semiconductor packages may be measured, and chamber settings may be accurately calibrated based on a temperature measurement result, thereby improving reliability of a test.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been shown and described above, it will be apparent to those skilled in the art that modifications and variations could be made without departing from the scope of the present inventive concepts as defined by the appended claims.

What is claimed is:

1. A test device comprising:

a test board;

a connector attached to a lower surface of the test board and configured to electrically connect the test board to a main board of a test layer;

a heating device on an upper surface of the test board, the heating device configured to emit heat in response to a signal input through the connector from a power supply of the test layer;

a temperature sensor on the upper surface of the test board, the temperature sensor configured to measure a temperature of the heating device; and a test socket on the upper surface of the test board, the test socket configured to transmit and receive a signal to and from the heating device and the temperature sensor, wherein the test device is configured to transmit, via the connector, information to the test layer, the information indicating a current flowing through the heating device and the temperature of the heating device to enable voltage adjustment by the power supply of the test layer, and wherein the test device is one of a plurality of test devices each connected to the test layer.

2. The test device of claim 1, wherein an area of the temperature sensor is smaller than an area of the heating device.

3. The test device of claim 1, wherein the temperature sensor is configured to:

measure a surface temperature of an upper surface of the heating device, when the temperature sensor is on the upper surface of the heating device; and measure a surface temperature of a lower surface of the heating device, when the temperature sensor is on the lower surface of the heating device.

4. The test device of claim 1, comprising:

at least one thermal resistor configured to add resistance for the heating device to achieve a target temperature.

5. The test device of claim 4, wherein at least one of the heating device, the temperature sensor, the test socket, and the thermal resistor is attachable to and detachable from the test board.

6. The test device of claim 1, wherein the test socket including at least one surface having a groove therein that extends to a periphery of the test socket such that the groove configured to control an amount of air flow introduced into the test socket based on a size and shape of the groove.

7. A test layer comprising:

a main board;

one or more test devices arranged in a first direction, parallel to an upper surface of the main board, and a second direction, orthogonal to the first direction; and a power supply connected to the main board, the power supply configured to apply a voltage to each of the one or more test devices, wherein each of the one or more test devices includes, a test board;

a connector attached to a lower surface of the test board;

a heating device on an upper surface of the test board, the heating device configured to emit heat in response to a signal input through the connector;

a temperature sensor on the upper surface of the test board, the temperature sensor configured to measure a temperature of the heating device; and a test socket on the upper surface of the test board, the test socket configured to transmit and receive a signal to and from the heating device and the temperature sensor, wherein the power supply includes a voltage output circuit configured to apply a voltage to each of the heating devices and a current sensing circuit configured to detect a current determined based on a voltage applied from each of the heating devices, and the power supply is configured to adjust a voltage applied to at least one of the heating devices based on the current detected by the current sensing circuit.

8. The test layer of claim 7, wherein the power supply is configured to:

increase the voltage applied to the heating device, when the current detected by the current sensing circuit is lower than a preset current; and reduce the voltage applied to the heating device, when the current detected by the current sensing circuit is higher than the preset current.

9. The test layer of claim 8, wherein the power supply is configured to apply different voltages to at least some test devices, among the one or more test devices.

10. The test layer of claim 9, wherein the power supply is configured to apply a higher voltage to a test device of the one or more test devices positioned to be farther from the power supply in the first direction than to a test device of the one or more test devices positioned to be closer to the power supply in the first direction.

11. The test layer of claim 7, wherein the test socket has at least one surface having a groove, and an amount of air introduced into the test socket varies based on a size and a shape of the groove.

12. The test layer of claim 11, wherein at least one groove has a different size and shape.

13. The test layer of claim 7, wherein an area of the temperature sensor is smaller than an area of the heating device.

14. The test layer of claim 7, wherein the temperature sensor is configured to:

measure a surface temperature of an upper surface of the heating device, when the temperature sensor is on the upper surface of the heating device; and measure a surface temperature of a lower surface of the heating device, when the temperature sensor is on the lower surface of the heating device.

15. The test layer of claim 7, comprising:

at least one thermal resistor.

16. A semiconductor manufacturing apparatus comprising:

a blower through which air is introduced from an external device;

a duct configured to receive the air from the blower;

a tester configured to conduct a test using the air supplied from the duct and to accommodate at least one test layer to be tested; and a controller connected to the blower, the duct, and the tester to control operations of the blower, the duct, and the tester, wherein the test layer includes a power supply, a main board, and one or more test devices, and each of the one or more test devices includes a temperature sensor, a heating device, and a test socket, the power supply is configured to supply a voltage to the heating device, the heating device is configured to emit heat, and the temperature sensor is configured to measure a temperature of the heating device during a period of time in which the duct supplies the air to the tester, and the controller is configured to convert a result of measuring the temperature into a digital signal and to output temperature distribution information according to positions of the one or more test devices through the digital signal.

17. The semiconductor manufacturing apparatus of claim 16, wherein the power supply is configured to apply different voltages to at least some test devices, among the one or more test devices.

18. The semiconductor manufacturing apparatus of claim 17, wherein the power supply is configured to apply a higher voltage to a test device of the one or more test devices positioned to be farther from the power supply in a first direction than to a test device of the one or more test devices positioned to be closer to the power supply in the first direction.

19. The semiconductor manufacturing apparatus of claim 16, wherein the temperature sensor is configured to:

measure a surface temperature of an upper surface of the heating device, when the temperature sensor is on the upper surface of the heating device; and measure a surface temperature of a lower surface of the heating device, when the temperature sensor is on the lower surface of the heating device.

20. The semiconductor manufacturing apparatus of claim 16, comprising:

at least one thermal resistor.

* * * * *